United States Patent
Abcarius

(10) Patent No.: US 10,447,282 B2
(45) Date of Patent: Oct. 15, 2019

(54) PHASE LOCKED LOOP (PLL)

(71) Applicant: QUALCOMM Incorporated, San Diego, CA (US)

(72) Inventor: John Abcarius, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/863,672

(22) Filed: Jan. 5, 2018

(65) Prior Publication Data

US 2019/0028109 A1    Jan. 24, 2019

Related U.S. Application Data

(60) Provisional application No. 62/535,157, filed on Jul. 20, 2017.

(51) Int. Cl.
*H03L 7/089* (2006.01)
*H03L 7/093* (2006.01)
*H04L 27/152* (2006.01)
*H04L 27/148* (2006.01)

(52) U.S. Cl.
CPC .......... *H03L 7/0891* (2013.01); *H03L 7/0893* (2013.01); *H03L 7/093* (2013.01); *H04L 27/148* (2013.01); *H04L 27/152* (2013.01)

(58) Field of Classification Search
CPC ..... H03L 7/0891; H03L 7/0893; H03L 7/093; H04L 27/148; H04L 27/152
See application file for complete search history.

(56) References Cited

U.S. PATENT DOCUMENTS

| | | | |
|---|---|---|---|
| 6,922,047 B2 * | 7/2005 | Knoll | H03L 7/0893 324/76.53 |
| 9,313,019 B2 | 4/2016 | Wu et al. | |
| 9,473,156 B2 | 10/2016 | Prummel et al. | |
| 9,503,254 B2 | 11/2016 | Rahbar et al. | |
| 2005/0218998 A1 * | 10/2005 | Lim | H03L 7/0893 331/16 |
| 2012/0146692 A1 * | 6/2012 | Yun | H03L 7/087 327/157 |
| 2014/0218082 A1 * | 8/2014 | Fan | H03H 19/004 327/157 |
| 2017/0098996 A1 | 4/2017 | Englekirk | |

OTHER PUBLICATIONS

Mano M., et al., "Design and Implementation of Modified Charge Pump for Phase Locked Loop", International Journal of Emerging Technology and Advanced Engineering, vol. 3 No. 2, Dec. 2013, pp. 558-562.

* cited by examiner

*Primary Examiner* — Daniel C Puentes
(74) *Attorney, Agent, or Firm* — Seyfarth Shaw LLP

(57) ABSTRACT

A phase locked loop (PLL) includes a first charge pump coupled to a filter. The first charge pump may feed the filter a first current. A second charge pump is coupled to the filter. The second charge pump may feed the filter a second current. A first gate is coupled to an input of the second charge pump. The first gate selectively gates the second current.

24 Claims, 8 Drawing Sheets

PHASE LOCKED LOOP (PLL)

CROSS-REFERENCE TO RELATED APPLICATION

The present application claims the benefit of U.S. Provisional Patent Application No. 62/535,157, filed on Jul. 20, 2017, and titled "ZERO FREQUENCY CONTROL IN AN AREA-EFFICIENT PHASE LOCKED LOOP (PLL) ARCHITECTURE," the disclosure of which is expressly incorporated by reference herein in its entirety.

TECHNICAL FIELD

The present disclosure generally relates to phase locked loops (PLLs). More specifically, the present disclosure relates to charge pumps in a PLL.

BACKGROUND

Mobile radio frequency (RF) chip designs (e.g., mobile RF transceivers) have migrated to deep sub-micron process nodes due to cost and power consumption considerations. The design complexity of mobile RF transceivers is further complicated by added circuit function to support communication enhancements. Further design challenges for mobile RF transceivers include analog/RF performance considerations, such as mismatch, noise, and other performance considerations. The design of these mobile RF chips includes the use of a phase locked loop (PLL), for example, to generate an output signal with a phase related to a phase of an input signal.

A PLL enables a closed-loop frequency control system that is based on a phase difference between the input clock signal and a feedback clock signal of a controlled oscillator. The main blocks of the PLL are a phase frequency detector (PFD), a charge pump, a loop filter, a voltage controlled oscillator (VCO), and counters. These counters may include a feedback counter (M), a pre-scale counter (N), and a post-scale counter (C).

Conventional, area-efficient phase locked loop architectures may employ a sampled-data approach with separate integral and proportional controls. The separate integral and proportional controls provide a way to stabilize the loop. In addition, alternating reference clock phases are used to ease settling constraints of different phases.

In practice, some issues arise with implementation of the area-efficient PLL architecture, such as in reducing a zero frequency (w_zero). In particular, if an integral current (Ipi) is too small, matching and speed may suffer. By contrast, increasing a proportional current (Ipp) may result in higher loading and power consumption issues. Reducing the zero frequency is a significant challenge in the area-efficient PLL architecture.

SUMMARY

A phase locked loop (PLL) may include a first charge pump coupled to a filter. The first charge pump may be configured to feed the filter a first current. A second charge pump may be coupled to the filter. The second charge pump may be configured to feed the filter a second current. A first gate may be coupled to the second charge pump. The first gate may be configured to selectively gate the second current.

A method of operating a phase locked loop (PLL) may include generating a first current from a first charge pump. The method may further include feeding the first current to a filter. The method may further include selectively gating a second current generated by a second charge pump.

A phase locked loop (PLL) may include a first charge pump coupled to a filter. The first charge pump may be configured to feed the filter a first current. A second charge pump may be coupled to the filter. The second charge pump may be configured to feed the filter a second current. First means for restricting current may be coupled to the second charge pump. The first current restricting means may be configured to selectively restrict the second current.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
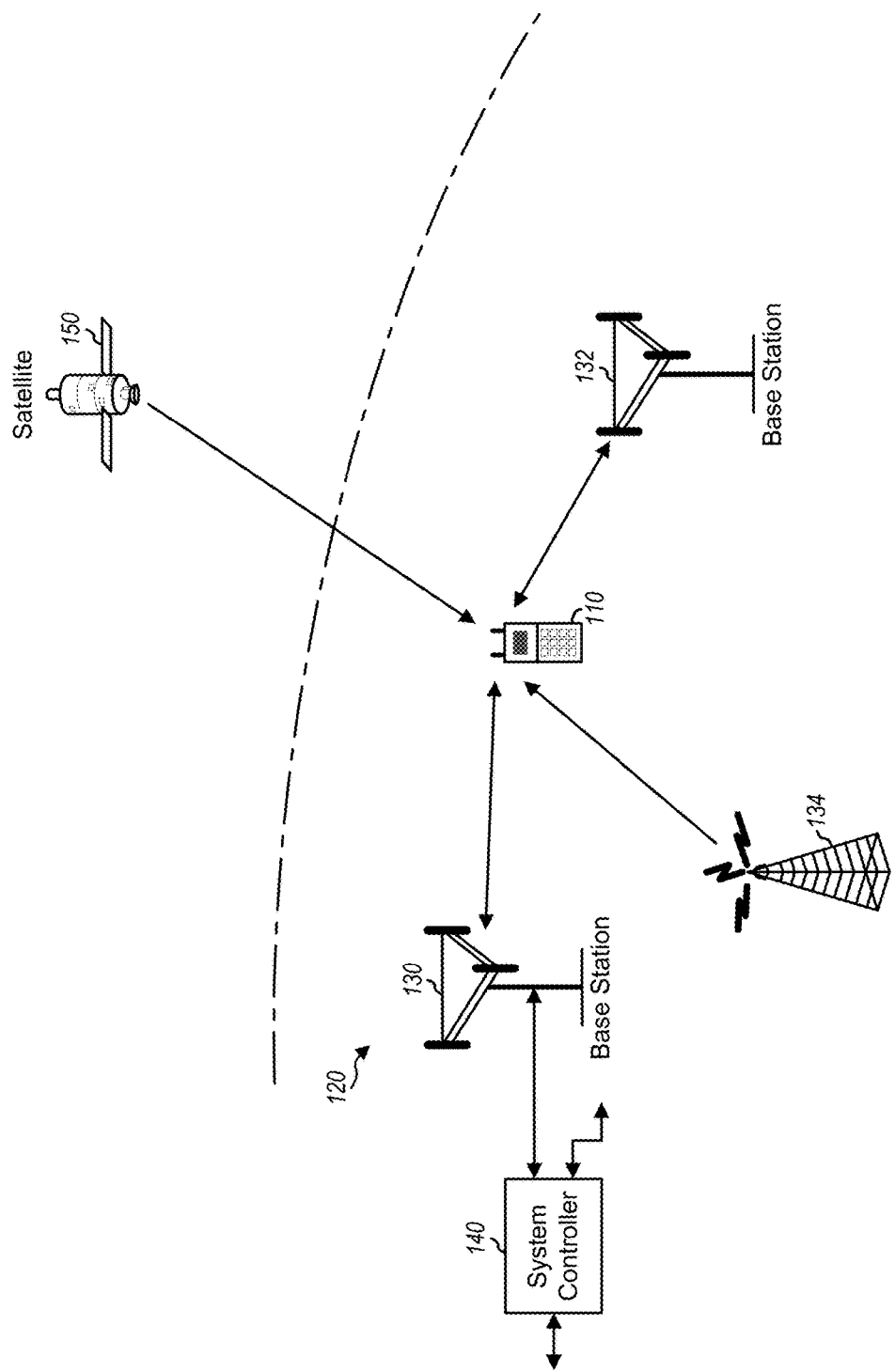
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. Other aspects, as well as features and advantages of various aspects, will become apparent to those of skill in the art through consideration of the ensuing description, the accompanying drawings, and the appended claims.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

A phase locked loop (PLL) circuit is often an important component of a device designed to operate in a wireless communication system. The PLL forces an oscillator of the PLL circuit (e.g., a voltage controlled oscillator (VCO), a digital controlled oscillator, a temperature controlled oscillator, or the like) to replicate and track a reference frequency and phase at an input when the PLL is in a lock configuration. When locked, the frequencies of the input (e.g., at a phase detector) and the divided output (e.g., at a VCO) are tracked exactly (e.g., output frequency corresponds to multiple of input frequency).

A PLL reference frequency may be derived from a local oscillator (e.g., crystal oscillator (XO)). For example, a frequency of the crystal oscillator may be around tens of megahertz (MHz) while the VCO may be configured to generate a periodic signal in the gigahertz (GHz) range. In this case, a divider configured to divide a clock by a factor of N may be interposed between the output of the VCO and the phase detector. When locked, the frequency at an output of the PLL (e.g., at a VCO) is N times the frequency of a clock signal presented at an input of the PLL (e.g., at a phase detector). For example, N*input frequency is equal to the output frequency. Thus, the output frequency of the VCO is set at a multiple of the input frequency by the frequency divider.

A phase frequency detector (PFD) of the PLL detects the difference in phase and frequency between the input clock and a feedback signal. In response, the PFD generates an "up" or "down" control signal based on whether the feedback signal is lagging or leading the reference signal. These "up" or "down" control signals determine whether the VCO operates at a higher or lower frequency, respectively. The PFD outputs these "up" and "down" signals to a charge pump. If the charge pump receives an up signal, current is driven into the loop filter. Conversely, if the charge pump receives a down signal, current is drawn from the loop filter. For example, the PFD includes a logic control unit with two input signals from a reference clock, a feedback signal, and output signals, Vup and Vdn, respectively. The charge pump is controlled by a control unit to generate output current pulses.

The loop filter converts these signals to a control voltage to bias the VCO. Based on the control voltage, the VCO oscillates at a higher or lower frequency, which affects the phase and frequency of the feedback signal. If the PFD produces an up signal, then the VCO frequency increases. A down signal decreases the VCO frequency. The VCO stabilizes once the reference signal and the feedback signal have the same phase and frequency. The loop filter filters out jitter by removing glitches from the charge pump and preventing voltage over-shoot. When the reference signal and the feedback signal are aligned, the PLL is considered locked.

Conventional, area-efficient phase locked loop (PLL) architectures may employ a sampled-data approach with separate integral and proportional controls as a way to stabilize the loop. Alternating reference clock phases can ease settling constraints of different phases.

A zero frequency (w_zero) occurs when the integral PLL loop gain (e.g., controlled by integral current (Ipi)) and proportional PLL loop gain (e.g., controlled by proportional current (Ipp)) are equal. As a result, the zero frequency depends on the ratio of these currents, multiplied by a reference clock frequency (Fref):

$$w\_zero=(Ipi/Ipp)*Fref$$

To maintain a high PLL phase margin and avoid peaking, it is desirable to maintain a large Ipp current-to-Ipi current ratio. Unfortunately, a large Ipp current-to-Ipi current ratio presents challenges in the physical implementation. For example, if the unit size (e.g., the Ipi current) is too small, matching and speed can suffer. Additionally, simply increasing the number of Ipp current units may lead to higher loading and power consumption.

The aspects of the present disclosure may be implemented in the system of FIGS. 1, 2, 3A-3B, and 7. More specifically, aspects of the present disclosure may be implemented in the wireless device of FIG. 2 and/or in the PLL of FIGS. 3A and 3B.

FIG. 1 shows a wireless device 110 communicating with a wireless communication system 120. The wireless device 110 includes zero frequency control in an area-efficient phase locked loop. The wireless communication system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
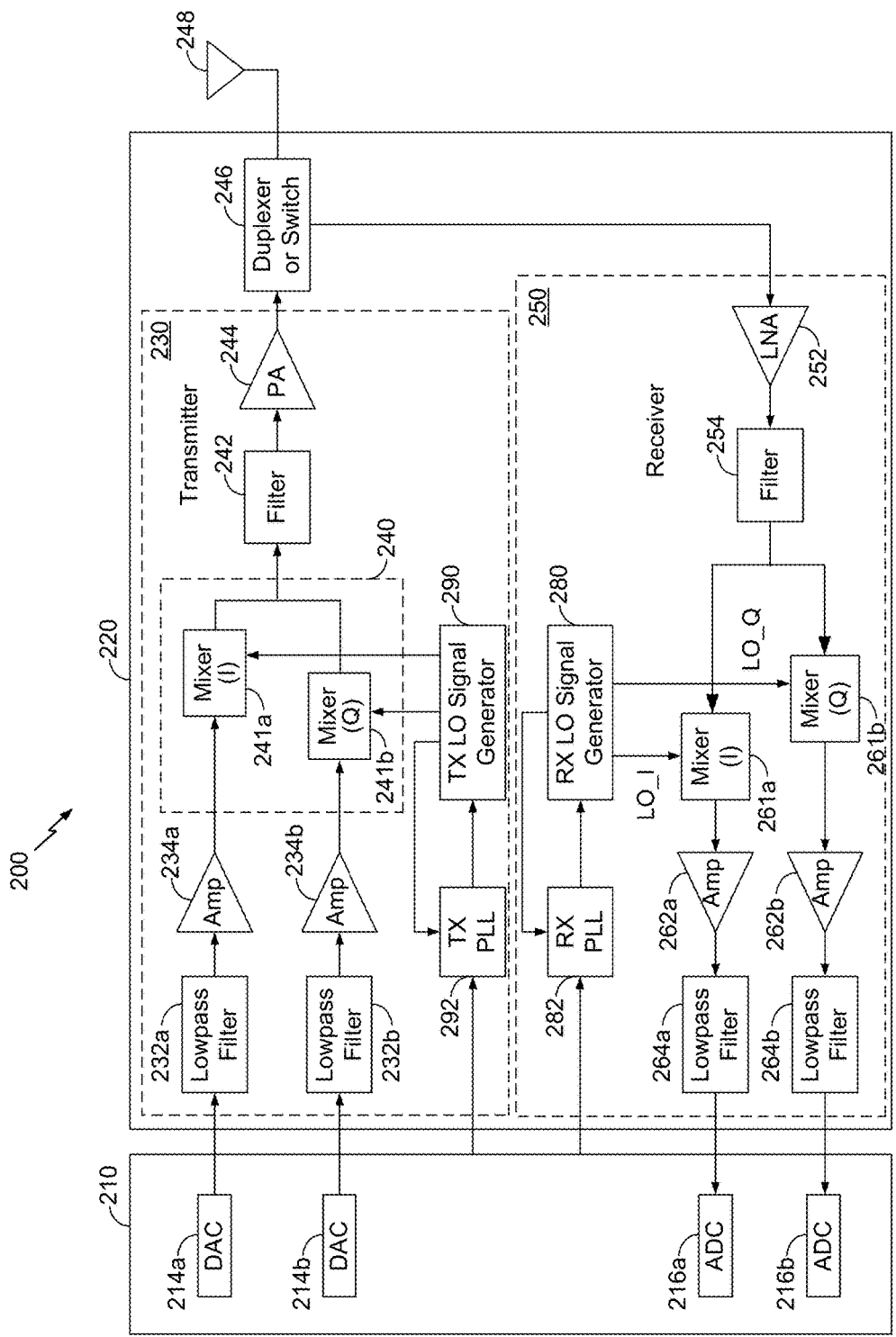
FIG. 2 shows a block diagram of the wireless device in FIG. 1.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214*a* and 214*b* for converting digital signals generated by the data processor 210 into the in-phase (I) and quadrature (Q) analog output signals (e.g., I and Q output currents) for further processing.

Within the transmitter 230, lowpass filters 232*a* and 232*b* filter the in-phase (I) and quadrature (Q) analog transmit signals, respectively, to reduce undesired images caused by the prior digital-to-analog conversion. Amplifiers (Amp) 234*a* and 234*b* amplify the signals from lowpass filters 232*a* and 232*b*, respectively, and provide in-phase (I) and quadrature (Q) baseband signals. An upconverter 240 including upconversion mixers 241*a* and 241*b* upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261*a* and 261*b* mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262*a* and 262*b* and further filtered by lowpass filters 264*a* and 264*b* to obtain in-phase (I) and quadrature (Q) analog input signals, which are provided to the data processor 210. In the exemplary configuration shown, the data processor 210 includes analog-to-digital converters (ADCs) 216*a* and 216*b* for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3A:
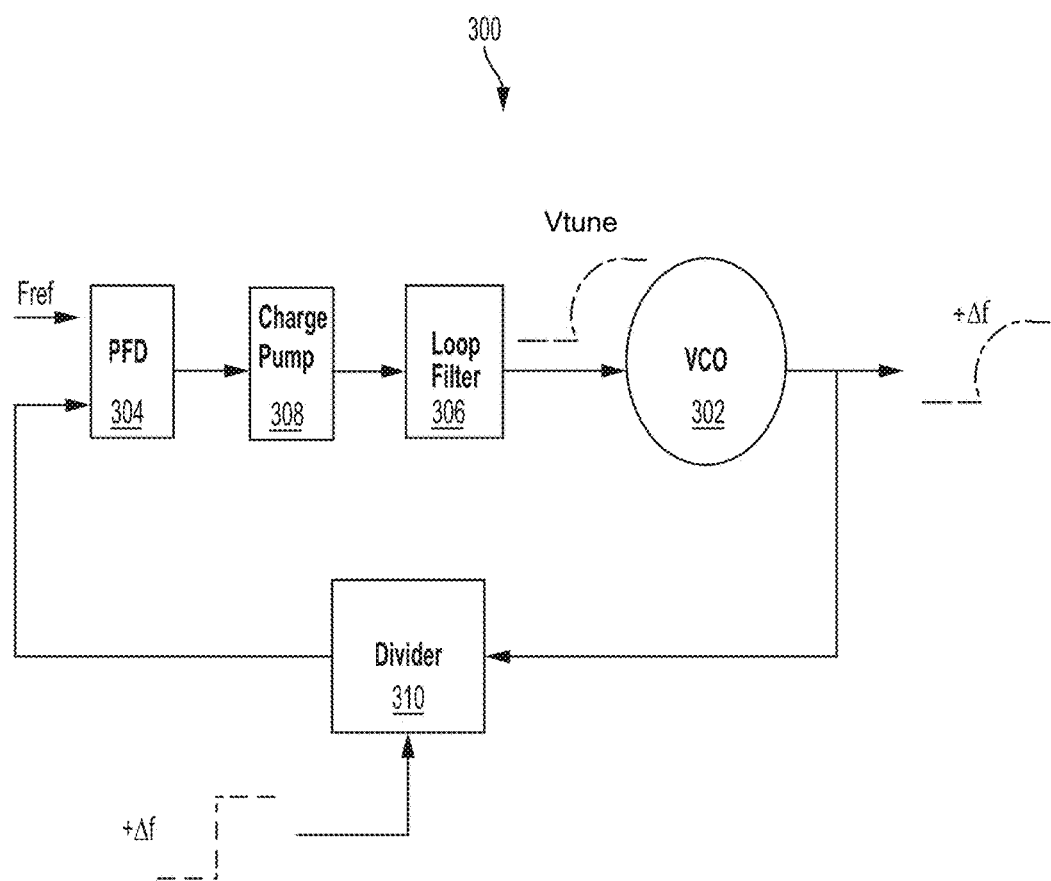
FIG. 3A illustrates a conventional phase locked loop (PLL) system.

FIG. 3A illustrates a conventional phase locked loop (PLL) system 300. The PLL system 300 includes a voltage controlled oscillator (VCO) 302, a phase frequency detector (PFD) 304, a loop filter (e.g., low pass filter) 306, a charge pump 308, and a frequency divider (e.g., integer-N synthesizer or fractional synthesizer) 310. The PLL system 300 may be integrated in a mobile communication device. For example, the PLL system 300 may be implemented in a radio frequency (RF) module of the mobile communication device.

The phase frequency detector 304 may be coupled to the charge pump 308, the charge pump 308 may be coupled to the loop filter 306, and the loop filter 306 may be coupled to the VCO 302. The VCO 302 may be coupled to the frequency divider 310, and the frequency divider 310 may be coupled to the phase frequency detector 304 to close a feedback loop. The output of the VCO 302 may be a frequency sinusoid that is controlled by a tuning voltage Vtune, which is received by the VCO 302 from the loop filter 306. For example, changing the tuning voltage Vtune changes the frequency of the VCO 302. To synthesize a desired frequency of the VCO 302, the output frequency of the VCO 302 is fed back to the frequency divider 310. The phase frequency detector 304 compares an output of the frequency divider 310 with a reference signal (e.g., reference signal Fref). In some aspects, the reference frequency may be generated by a stable local crystal oscillator (not shown).

For example, if the reference frequency of the crystal oscillator is set at 40 MHz and the output of the VCO 302 is set at 4 GHz, the frequency divider 310 receives a 4 GHz output of the VCO 302. The frequency divider 310 is programmed to divide by 100 to provide an output frequency to the phase frequency detector 304 that matches the reference frequency received at the phase frequency detector 304. The phase frequency detector 304 compares a phase of the reference frequency and the output frequency of the frequency divider 310 and generates an error signal, proportional to a phase difference between the two frequencies. An analog multiplier or mixer can be used as the phase frequency detector 304. Because the reference frequency and the output from the frequency divider 310 are the same when the loop is locked, the output of the phase frequency detector 304 contains a direct current (DC) component and a signal at twice the frequency (e.g., this is true when the phase frequency detector is in the form of a multiplier or mixer). The DC component is proportional to the phase difference. The double frequency component is removed by the loop filter 306. Any phase difference then shows up as a control voltage (e.g., tuning voltage (Vtune)) to the VCO 302 after filtering.

Figure 3B:
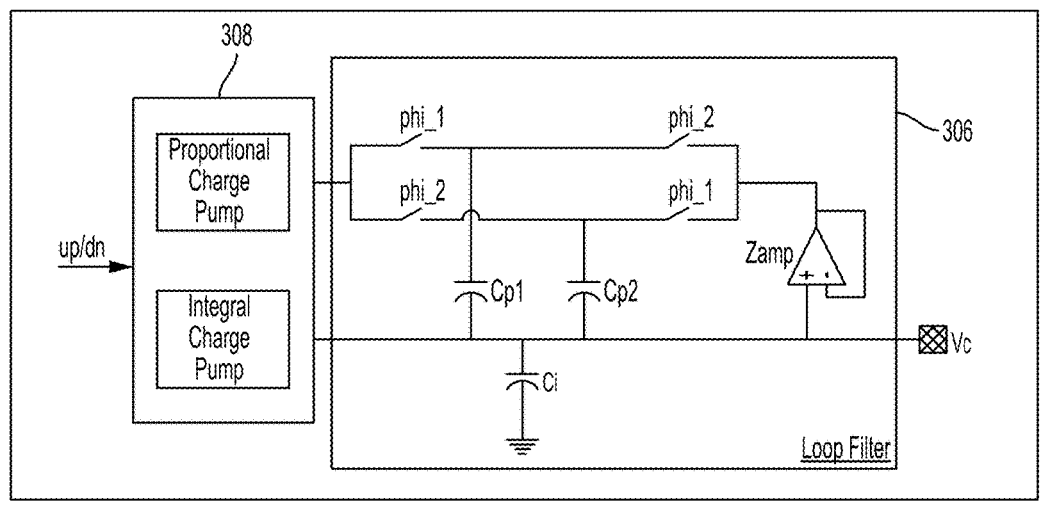
FIG. 3B illustrates a conventional loop filter.

FIG. 3B illustrates a loop filter 306 of the PLL system 300. For example, the loop filter 306 may include separate integral and proportional controls in a charge pump 308 as a way to stabilize the PLL system 300. Additionally, switches phi_1 and phi_2 may be active on alternate reference clock phases.

A proportional path gain of the loop filter 306 may be approximated as:

$$\text{gain} = (Ipp * Kvco \text{ (Hz/V)})/(s * Cint * Fref * N), \quad (1)$$

where Cint=Ci, s represents the Laplace complex variable (frequency), Kvco is the gain of the VCO 302 in hertz per volt (Hz/V), Fref is the reference frequency, and N is the divider value of the frequency divider 310.

This implies the PLL bandwidth (w_pll) may be given by:

$$w\_pll = (Ipp * Kvco)/(Cint * N * Fref), \quad (2)$$

where Ipp is the proportional gain/current.

The integral path gain may then be written as:

$$\text{gain} = (Ipi * Kvco)/(s^2 * Cint * N) \quad (3)$$

A zero frequency ($w_{zero}$) occurs when the integral gain/current (Ipi) and the proportional gain/current (Ipp) are equal, that is:

$$w_{zero} = \left(\frac{Ipi}{Ipp}\right) * Fref \quad (4)$$

With each of the Ipi current and the Ipp current made of identical unit devices, the zero frequency $w_{zero}$ can be well controlled. To maintain a high PLL phase margin and avoid peaking, it is desirable to keep a PLL bandwidth/zero frequency ($w_{pll}/w_{zero}$) ratio large. The maximum $w_{pll}$ is usually limited by the constraints of the reference (sampling) frequency (Fref) and other high order poles (HOPs) in the PLL system 300. Therefore, keeping the $w_{pll}/w_{zero}$ ratio large may be achieved by a large Ipp current/Ipi current (Ipp/Ipi) ratio.

A large Ipp/Ipi, however, presents challenges in the physical implementation. For example, if the unit size (e.g., the Ipi current) is too small, matching and speed can suffer. Additionally, simply increasing the number of Ipp current units leads to higher loading and power consumption.

Aspects of the present disclosure overcome these challenges by modulating a frequency with which an integral correction is made to the loop filter. For example, the Ipi current may be gated, so that the Ipi current is injected less often, resulting in an average reduction in the Ipi current. Additionally, the Ipi current may be diverted into a proportional path half of the time, and directly injected through an integral path the other half of the time.

Figure 4A:
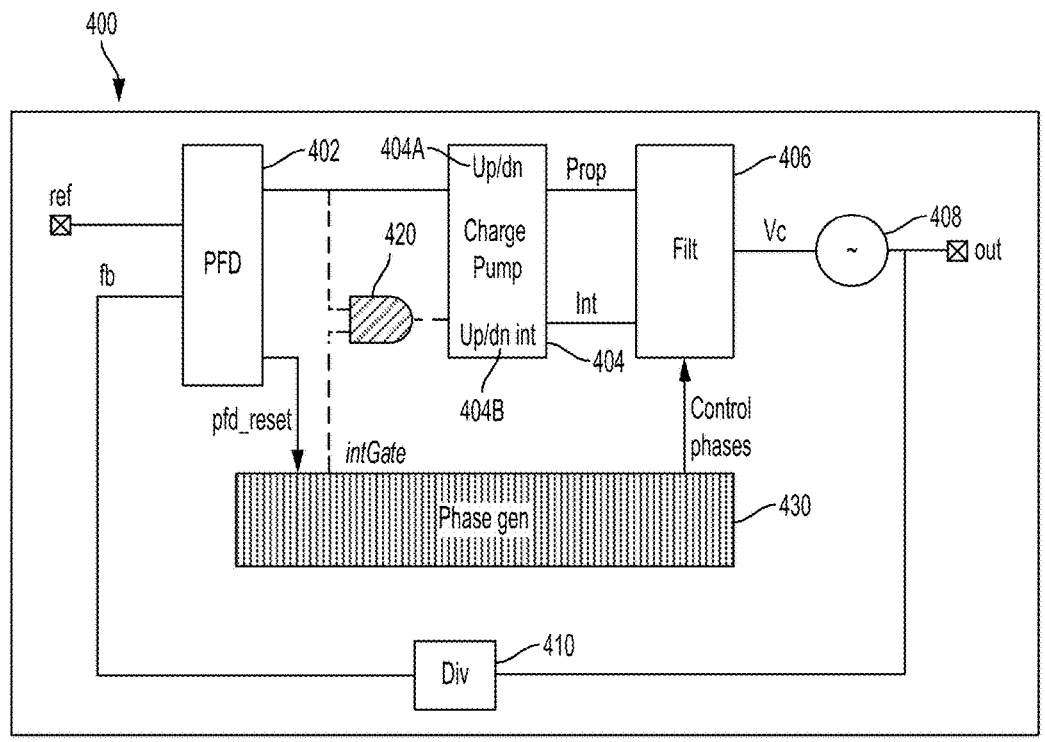
FIGS. 4A and 4B illustrate phase locked loops (PLLs) according to aspects of the present disclosure.

FIG. 4A illustrates a phase locked loop (PLL) 400 (e.g., a type II PLL) according to aspects of the present disclosure. The PLL 400 may include a phase frequency divider (PFD) 402 coupled to a charge pump 404. The charge pump 404 may be coupled to a filter 406 (e.g., a loop filter). The filter 406 may be coupled to a VCO 408. The VCO 408 may be coupled to a divider 410, and the divider 410 may be coupled to the PFD 402 to close a feedback loop.

According to aspects of the present disclosure, the charge pump 404 may include a first charge pump 404A and a second charge pump 404B. For example, the first charge pump 404A (e.g., a proportional charge pump) may feed the filter 406 with a first current (e.g., the proportional current (Ipp)), and the second charge pump 404B (e.g., an integral charge pump) may feed the filter 406 with a second current (e.g., the integral current (Ipi)).

According to additional aspects, the PLL 400 may further include a gate 420 (e.g., a first gate) and a phase generator 430. The gate 420 may be coupled to an input of the second charge pump 404B. For example, the gate 420 may include gates, multiplexers, switches, and/or a gating signal. According to an aspect of the present disclosure, the gates may include AND, NAND, OR, NOR, and other such logic gates. The phase generator 430 may be coupled to the gate 420 and the filter 406 for delivering a clock signal that controls the gate 420 and the filter 406. For example, a phase signal (e.g., intGate) may control gating of the gate 420.

The PLL 400 achieves a reduction in zero frequency $w_{zero}$ over the PLL system 300 without modifying the charge pump 404. Instead of reducing the unit Ipi current, the same average Ipi current may be achieved by modulating a frequency at which an integral correction is made to the filter 406. For example, an input signal may be gated by the gate 420 so that the Ipi current is injected less often (e.g., half as often), resulting in an average reduction in the Ipi current. The reduced Ipi current results in the desired reduction in zero frequency $w_{zero}$.

Figure 4B:
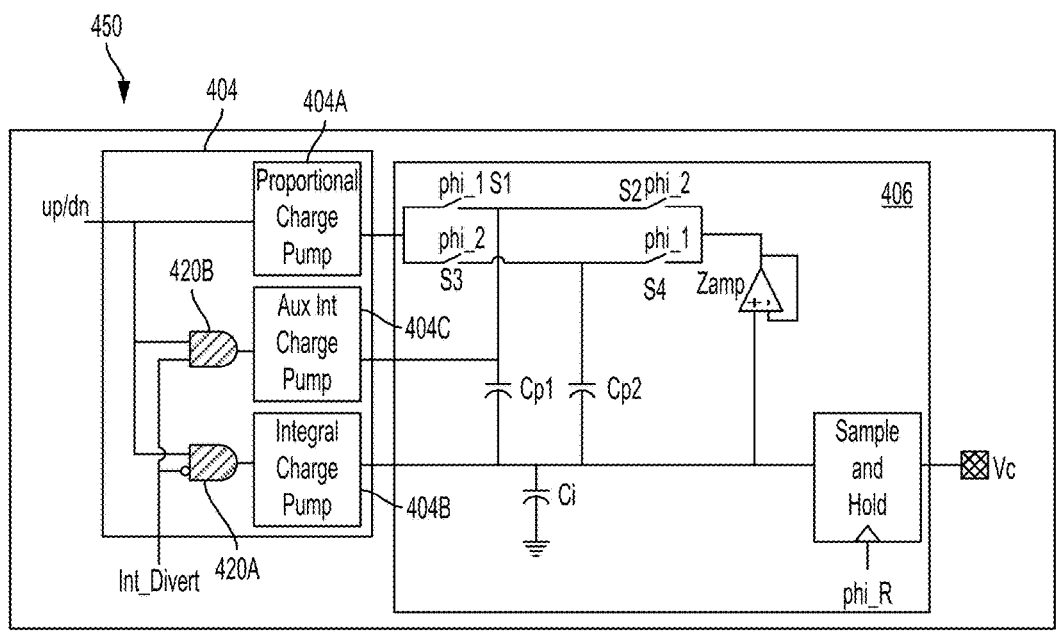

FIG. 4B illustrates a phase locked loop (PLL) 450 (e.g., a type II PLL) according to aspects of the present disclosure. For example, the PLL 450 may include a charge pump 404 coupled to a filter 406 (e.g., a loop filter). The charge pump may include the first charge pump 404A, the second charge pump 404B, and a third charge pump 404C. For example, the third charge pump 404C (e.g., an auxiliary integral charge pump) may feed the filter 406 a third current (e.g., an auxiliary integral current). The third current may be the Ipi current. A sample and hold circuit may provide reference spur suppression by reducing the variation seen on the voltage at Vc.

According to an aspect of the present disclosure, a first gate 420A may be coupled to an input of the second charge pump 404B, and a second gate 420B may be coupled to an input of the third charge pump 404C. For example, the first gate 420A and the second gate 420B may include gates, multiplexers, switches, and/or a gating signal. The gates may also include AND, NAND, OR, NOR, and other such logic gates. For example, the filter 406 may be a resampling switch coupled to an output of the second charge pump 404B.

In operation, a control signal (e.g., up/dn) may be diverted through the third charge pump 404C some of the time (e.g., half of the time), and may be directed through the second charge pump 404B the rest of the time (e.g., other half of the time). For example, the control signal may be input to both the first gate 420A and the second gate 420B simultaneously. During some of the time, the first gate 420A may block the control signal, such that the control signal is only allowed through the second gate 420B. During the rest of the time, the second gate 420B may block the control signal, such that the control signal is only allowed through the first gate 420A. For example, the first gate 420A and the second gate 420B may alternatingly gate the control signal. In this way, the control signal may be diverted to either the second charge pump 404B or the third charge pump 404C using the first gate 420A and the second gate 420B.

According to aspects of the present disclosure, the capacitor Ci (e.g., an integral capacitor) may be configured to receive or discharge the same instantaneous charge regardless of whether or not the control signal was diverted. As such, this suppresses a spur that could otherwise occur at half the reference frequency due to the modulation of the Ci voltage. For example, when the control signal is diverted through the third charge pump 404C, it has a temporary (e.g., non-integral) effect on the control voltage (Vc) and does not accumulate (e.g., integrate). Additionally, a zeroing amplifier (Zamp) may zero out either capacitor Cp1 or Cp2 on subsequent clock phases.

According to an aspect, the intGate signal may be replaced with an Int_Divert signal. For example, the Int_Divert signal may select whether the input current is injected directly into the second charge pump 404B or, instead, through the third charge pump 404C, such that the Ipi current is in parallel with the Ipp current. For example, the Ipi current directly injects charge into Ci when the input current is directed through the second charge pump 404B and not gated by the first gate 420A.

According to aspects of the present disclosure, the filter 406 may include switches S1-S4. For example, switches S1 and S3 may be controlled by a clock signal phi_1, and switches S2 and S4 may be controlled by a clock signal phi_2. Switches S1 and S2 may be coupled in series, and switches S3 and S4 may also be coupled in series. Switches S1 and S2 may be coupled in parallel with switches S3 and S4. Switches S1 and S3 may be directly coupled to an output of the first charge pump 404A. An output of switches S2 and S4 may be coupled to the zeroing amplifier Zamp.

According to aspects of the present disclosure, capacitor Cp1 (e.g., a first capacitor) may be coupled to an output of switch S1 (e.g., a first switch). Capacitor Cp2 (e.g., a second capacitor) may be coupled to an output of switch S3 (e.g., a second switch). Capacitor Ci may be coupled in parallel to capacitors Cp1 and Cp2.

According to additional aspects of the present disclosure, the first gate 420A may be coupled to an input or an output of the second charge pump 404B. The second gate 420B may be coupled to an input or an output of the third charge pump 404C. for example, the gates 420A, 420B may be coupled between the charge pumps 404B, 404C and the filter 406. Coupling the gates 420A, 420B to outputs of the charge pumps 404B, 404C may aid in controlling gain.

Advantages include reduction of $w_{zero}$ and improvement to phase margin, while suppressing frequency spurs. Additionally, the PLLs may be implemented using only switches and capacitors (e.g., switched capacitors), rather than with resistors and capacitors. This way, capacitors are not matched with resistors, which results in increased flexibility in PLL architectures.

Figure 5:
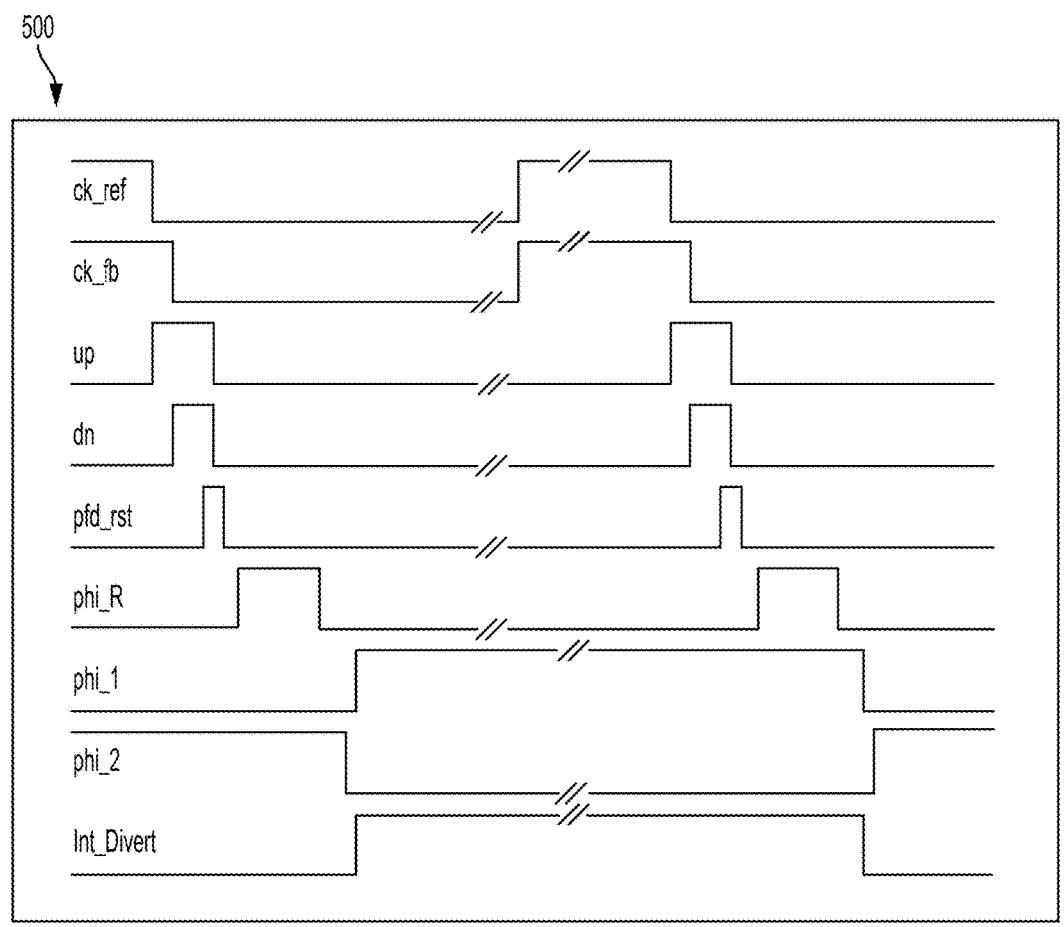
FIG. 5 depicts a timing diagram for a phase locked loop (PLL) according to aspects of the present disclosure.

FIG. 5 depicts a timing diagram 500 for a phase locked loop (PLL) according to aspects of the present disclosure. The various signals are as follows: (1) a ck_ref signal is the reference clock; (2) a ck_fb signal is the feedback clock (e.g., in this case, the ck_fb is slower); and (3) up and dn (down) signals are the signals generated by the PFD based on a difference between ck_ref and ck_fb. For example, a difference between the up and dn signals represents the difference.

The various signals also include: (4) a pfd_rst signal is the PFD reset pulse for resetting the PFD; (5) a phi_R signal is a clock signal for controlling the switch, which helps to reduce spurs; (6) a phi_1 signal is the Phase 1 clock; and (7) a phi_2 signal is the Phase 2 clock.

According to an aspect of the present disclosure, the phi_1 and phi_2 signals may alternate, and may be toggled by ck_ref. For example, when phi_1 is high, phi_2, is low, and vice versa. This way, half of the circuit is charging, while the other half is resetting.

An additional signal (8) is an Int_Divert signal, which is the integral divert signal that matches either phi_1 or phi_2. For example, Int_Divert may match phi_1. Int_Divert may be set to toggle with a 50% duty cycle by having it match the phi_1 or phi_2 phase. With this setting, the integral path gain (and zero frequency) may be reduced by a factor of two.

The timing diagram 500 depicted show alignment of the falling edges, but the present disclosure also contemplates alignment of the rising edges.

During operation, on one phase (e.g., phi_1), capacitors Cp1 and Ci may each be charged with charge $\Delta Qp(n)$ (e.g., the value of a charge across each capacitor). During the same phase, the zeroing amplifier Zamp works to make its output equal its input. By action of the zeroing amplifier Zamp, any prior charge on Cp2 (e.g., $\Delta Qp(n-1)$) is removed, as is equal charge from Ci by the same "zeroing" current of the zeroing amplifier Zamp. Therefore, at the end of phi_1, Ci has charge $\Delta Qp(n)$ added to it and $\Delta Qp(n-1)$ removed. In this way, the effect of the Ipp current is temporary, lasting only one cycle, and not integrated.

Figure 6:
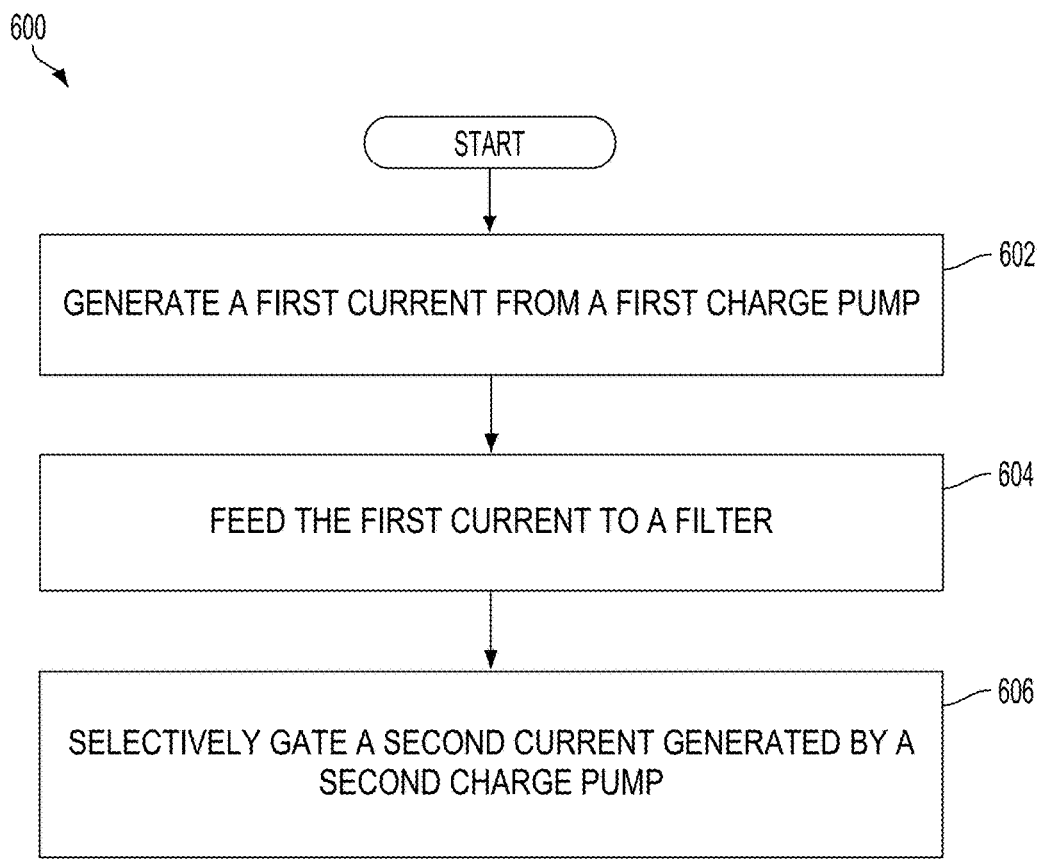
FIG. 6 depicts a simplified flowchart of a method for operating a phase locked loop (PLL) according to aspects of the present disclosure.

FIG. 6 depicts a simplified flowchart of a method 600 for operating a phase locked loop (PLL). At block 602, a first current is generated from a first charge pump. For example, the first charge pump 404A (e.g., a proportional charge pump) may generate a proportional current (Ipp).

At block 604, the first current is fed to a filter. For example, the first charge pump 404A may feed the Ipp current to the filter 406.

At block 606, a second current generated by a second charge pump is selectively gated. For example, the second charge pump 404B (e.g., an integral charge pump) may feed the filter 406 an integral current (Ipi). The Ipi current may be gated by gate 420 so that the Ipi current is injected less often (e.g., half as often), resulting in an average reduction in the Ipi current. The reduced Ipi current results in the desired reduction in $w_{zero}$.

According to one aspect of the present disclosure, a phase locked loop (PLL) is described. The PLL includes means for generating phase. The PLL also includes first means for restricting current and second means for restricting current. The phase generating means may be, for example, the phase generator 430 of FIG. 4A. The first and second current restricting means may be, for example, the first gate 420A and the second gate 420B of FIG. 4B. In another aspect, the aforementioned means may be any module or any apparatus or material configured to perform the functions recited by the aforementioned means.

Figure 7:
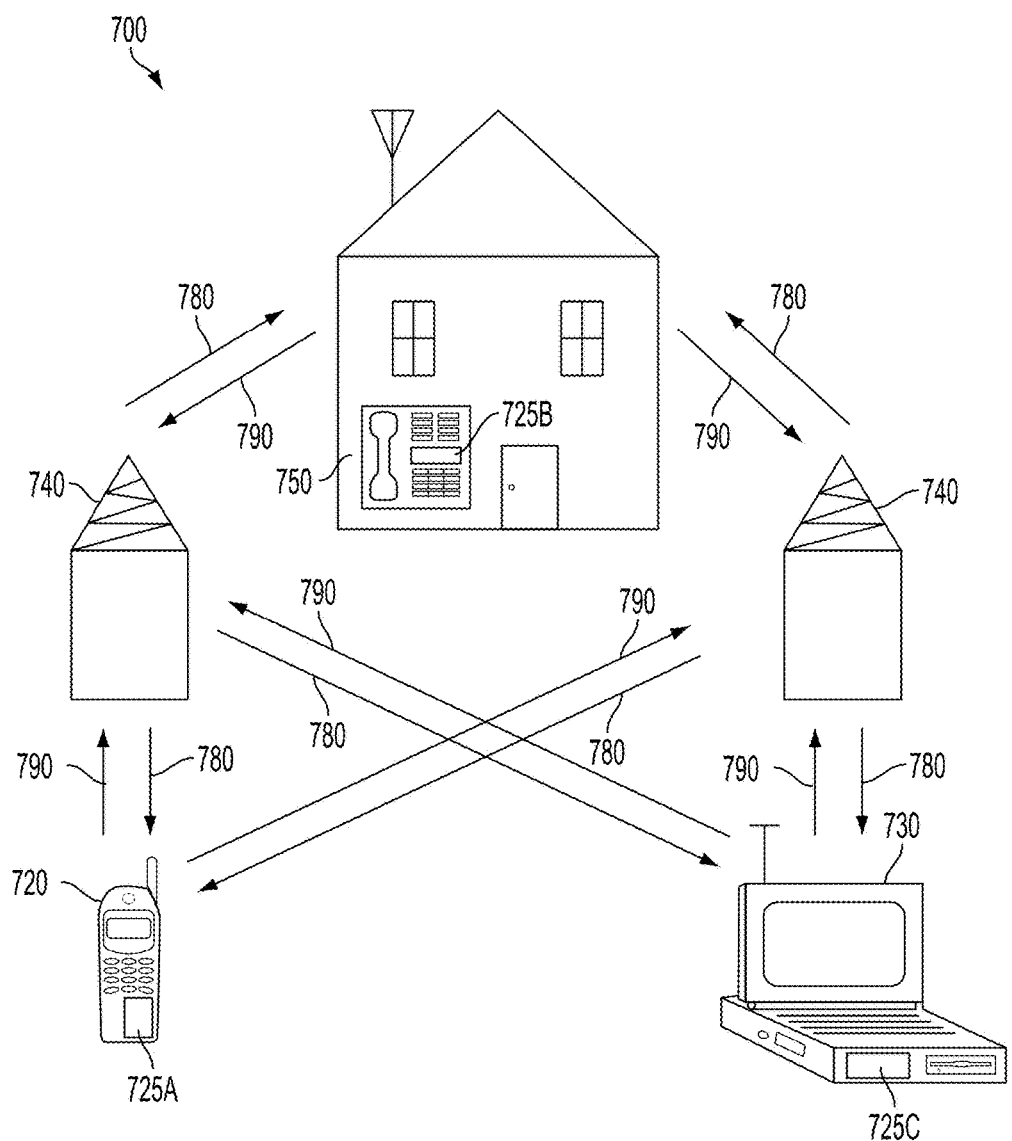
FIG. 7 is a block diagram showing an exemplary wireless communication system in which a configuration of the disclosure may be advantageously employed.

FIG. 7 is a block diagram showing an exemplary wireless communication system in which a configuration of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725B, and 725C that include the disclosed phase locked loop (PLL). It will be recognized that other devices may also include the disclosed PLL, such as the base stations, switching devices, and network equipment. FIG. 7 shows forward link signals 780 from the base station 740 to the remote units 720, 730, and 750 and reverse link signals 790 from the remote units 720, 730, and 750 to base station 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the phase locked loop.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A phase locked loop (PLL) comprising:
a first charge pump coupled to a filter having first and second input nodes, the first charge pump coupled to the first input node, the first charge pump configured to feed the filter a first current via the first input node;
a second charge pump coupled to the filter via the second input node, the second charge pump configured to feed the filter a second current via the second input node; and
a first gate coupled to the second charge pump, the first gate configured to selectively provide an input signal to the second charge pump, in which only the second charge pump of the first and the second charge pumps is gated at its input so that the second current is injected less often, in which a phase detector is coupled to the first charge pump to provide an input signal to the first charge pump.

2. The PLL of claim 1, further comprising:
a third charge pump coupled to the filter, the third charge pump configured to feed the filter a third current; and
a second gate coupled to the third charge pump, the second gate configured to selectively gate the third current.

3. The PLL of claim 2, further comprising a phase generator coupled to the first gate, the second gate, and the filter.

4. The PLL of claim 3, in which the phase generator is configured to generate a phase signal for controlling the first gate and the second gate.

5. The PLL of claim 2, in which the first gate and the second gate are configured to alternatingly gate a control signal.

6. The PLL of claim 5, in which the control signal is input to both the first gate and the second gate.

7. The PLL of claim 1, further comprising a phase generator coupled to the first gate and the filter.

8. The PLL of claim 7, in which the phase generator is configured to generate a phase signal for controlling the first gate.

9. The PLL of claim 1, in which the filter comprises an integral capacitor coupled to an output of the second charge pump, and a zeroing amplifier coupled to an output of the first charge pump.

10. The PLL of claim 1, in which the filter comprises a resampling switch coupled to an output of the second charge pump.

11. The PLL of claim 1, in which the filter is a loop filter.

12. The PLL of claim 1, in which the filter comprises a first capacitor coupled to a first switch and a second capacitor coupled to a second switch.

13. The PLL of claim 12 in which the first switch and the second switch are coupled to a same output of the first charge pump.

14. A method of operating a phase locked loop (PLL), comprising:
generating a first current from a first charge pump, the first charge pump coupled to a first input node of a filter;
feeding the first current to the first input node of the filter;
selectively gating a second current generated by a second charge pump, the second charge pump coupled to a second input node of the filter, in which the filter comprises an integral capacitor coupled to an output of the second charge pump, and a zeroing amplifier coupled to an output of the first charge pump; and
selectively gating a third current generated by a third charge pump.

15. The method of claim 14, further comprising feeding the second current to the second input node of the filter.

16. The method of claim 14, further comprising feeding the third current to the filter.

17. A phase locked loop (PLL) comprising:
a first charge pump coupled to a filter having first and second input nodes, the first charge pump coupled to the first input node, the first charge pump configured to feed the filter a first current via the first input node;
a second charge pump coupled to the filter via the second input node, the second charge pump configured to feed the filter a second current via the second input node;
first means for restricting current coupled to the second charge pump, the first current restricting means configured to selectively restrict the second current;
a third charge pump coupled to the filter, the third charge pump configured to feed the filter a third current; and
second means for restricting current coupled to the third charge pump, the second current restricting means configured to selectively restrict the third current, in which the first means for restricting and the second means for restricting comprise means for alternatingly restricting a control signal input to both the first means for restricting and the second means for restricting.

18. The PLL of claim 17, further comprising means for generating phase, the phase generating means coupled to the first means for restricting, the second means for restricting, and the filter.

19. The PLL of claim 17, further comprising means for generating phase, the phase generating means coupled to the first current restricting means and the filter.

20. The PLL of claim 17, in which the filter comprises an integral capacitor coupled to an output of the second charge pump, and a zeroing amplifier coupled to an output of the first charge pump.

21. The PLL of claim 17, in which the filter comprises a resampling switch coupled to an output of the second charge pump.

22. The PLL of claim 17, in which the filter is a loop filter.

23. The PLL of claim 17, in which the filter comprises a first capacitor coupled to a first switch and a second capacitor coupled to a second switch.

24. The PLL of claim 23 in which the first switch and the second switch are coupled to a same output of the first charge pump.

* * * * *